United States Patent [19]

Numata

[11] Patent Number: 5,476,817
[45] Date of Patent: Dec. 19, 1995

[54] METHOD OF MAKING RELIABLE METAL LEADS IN HIGH SPEED LSI SEMICONDUCTORS USING BOTH DUMMY LEADS AND THERMOCONDUCTIVE LAYERS

[75] Inventor: Ken Numata, Dallas, Tex.

[73] Assignee: Texas Instruments Incorporated, Dallas, Tex.

[21] Appl. No.: 250,888

[22] Filed: May 31, 1994

[51] Int. Cl.$^6$ .................................................. H01L 21/44
[52] U.S. Cl. ............................................. 437/195; 437/190
[58] Field of Search ..................................... 437/190, 195

[56] References Cited

U.S. PATENT DOCUMENTS

| 4,987,101 | 1/1991 | Kaanta et al. | 437/228 |
| 5,103,288 | 4/1992 | Sakamoto et al. | 357/71 |
| 5,155,576 | 10/1992 | Mizushima | 357/71 |
| 5,324,683 | 6/1994 | Fitch et al. | 437/65 |

OTHER PUBLICATIONS

Wolf et. al, vol. II, Silicon Processing for the VLSI Era, Lattice Press, 1990.
Takashi Fukada and Takashi Akahori, "Preparation of SiOF Films with Low Dielectric Constant by ECR Plasma Chemical Vapor Deposition", International Conference on Solid State Devices and Materials, 1993, pp. 158–160.
P. Bruesch, F. Stucki, Th. Baumann, P. Kluge–Weiss, B. Bruhl, L. Niemeyer, R. Strumpler, B. Ziegler, M. Mielke, "Electrical and Infrared Dielectrical Properties of Silica Aerogels and of Silica–Aerogel–Based Composites", Appl. Phys. A 57, 1993, pp. 329–337.
Shinichi Ito and Yoshio Homma, "Application of Surface Reformed Thick Spin–on–Glass to MOS Device Planarization", Electrochem. Soc., vol. 137, no. 4, Apr. 1990, pp. 1213–1218.
"Chronological Scientific Tables" Ed. Tokyo Astronomical Observatory, Published in Maruzen, Tokyo (1986).
K. E. Goodson, M. I. Flik, L. T. Su, and Dimitri A. Antoniadis, Fellow, IEEE, "Annealing–Temperature Dependence of the Thermal Conductivity of LPCVD Silicon–Dioxide Layers", IEEE Device Letters, vol. 14, No. 10, Oct., 1993, pp. 490–492.
E. U. Condon, Ph.D., "Heat and Thermodynamics", Handbook of Physics, Second Edition.
Katsuyuki Musaka, Shinsuke Mizuno, Kiyoaki Hara, "Single Step Gap Filling Technology For Subhalf Micron Metal Spacings on Plasma Enhanced TEOS/$O_2$ Chemical Vapor Deposition System", Applied Materials Japan Inc. Technology Center, pp. 510–512.
Takashi USAMI, Kimiaki Shimokawa and Masaki Yoshimaru, "Low Dielectric Constatn Interlayer Using Flouride Doped Silicon Oxide", 1993 Internation Conference on Solid State Devices and Materials, Makuhari, pp. 161–163.

Primary Examiner—Brian E. Hearn
Assistant Examiner—Lynne A. Gurley
Attorney, Agent, or Firm—Kay Houston; James Brady; Richard Donaldson

[57] ABSTRACT

A method for manufacturing semiconductor device having metal leads 14 with improved reliability, and device for same, comprising metal leads 14 on a substrate 12, a low-dielectric constant material 18 at least between the metal leads 14, and thermoconductive insulating layer 22 deposited on the metal leads 14 and the low-dielectric constant material 18, and dummy leads 16 proximate metal leads 14. Heat from the metal leads 14 is transferable to the dummy leads 16 and thermoconductive insulating layer 22, which are both capable of dissipating the heat. A thin thermoconductive layer 24 may be deposited over the metal leads 14 prior to depositing at least the low-dielectric constant material 18 and the thermoconductive insulating layer 22. The low-dielectric constant material 18 has a dielectric constant of less than 3.5. An advantage of the invention is to improve reliability of metal leads for circuits using low-dielectric constant materials.

18 Claims, 2 Drawing Sheets

METHOD OF MAKING RELIABLE METAL LEADS IN HIGH SPEED LSI SEMICONDUCTORS USING BOTH DUMMY LEADS AND THERMOCONDUCTIVE LAYERS

CROSS-REFERENCE TO RELATED APPLICATIONS

The following co-assigned U.S. patent applications are hereby incorporated herein by reference:

| TI Case | Ser. No | Filing Date | Inventor | Title |
|---------|---------|-------------|----------|-------|
| TI-18509 | 08/137,658 | 10/15/93 | Jeng | Planarized Structure for Line-to-Line Capacitance Reduction |
| TI-18867 | 08/201,679 | 2/25/94 | Jeng et al | Selective Filling Narrow Gaps with Low-dielectric-constant materials |
| TI-18929 | 08/202,057 | 2/25/94 | Jeng | Planarized Multilevel Interconnect Scheme with Embedded Low-Dielectric-Constant Insulators |
| TI-19068 | — | 4/28/94 | Cho | Low Dielectric Constant Insulation in VLSI applications |
| TI-19071 | — | 4/27/94 | Havemann | Via Formation in Polymeric Materials |
| TI-18941 | — | 5/20/94 | Gnade et al | A Low Dielectric Constant Material for Electronics Applications |
| TI-19072 | — | 5/20/94 | Havemann et al | Interconnect Structure with an Integrated Low Density Dielectric |
| TI-19305 | — | 5/27/94 | Havemann et al | Multilevel Interconnect Structure with Air Gaps Formed Between Metal Leads |
| TI-19253 | — | 5/27/94 | Havemann | Two-step Metal Etch Process for Selective Gap Fill of Submicron Interconnects and Structure for Same |
| TI-19179 | — | 5/27/94 | Gnade et al | Low Dielectric Constant Layers via Immiscible Sol-gel Processing |
| TI-19073 | — | 5/27/94 | Tigelaar et al | Suppression of Interlead Leakage when using Airgap Dielectric |
| TI-19154 | — | 5/27/94 | Tsu | Reliability Enhancement of Aluminum Interconnects by Reacting Aluminum Leads with a Strengthening Gas |

The following U.S. patent applications filed concurrently herewith the patent application for the present invention, are also incorporated herein by reference:

| TI Case | Inventor | Title |
|---------|----------|-------|
| TI-19150 | Numata | Improving Reliability of Metal Leads in High Speed LSI Semiconductors using Dummy Leads |
| TI-18895 | Numata | Improving Reliability of Metal Leads in High Speed LSI Semiconductors using Thermoconductive Dielectric Layer |

FIELD OF THE INVENTION

This invention relates generally to the fabrication of semiconductor devices, and more specifically to semiconductors with submicron spacing and low-dielectric constant materials between the intermetallic leads.

BACKGROUND OF THE INVENTION

Semiconductors are widely used in integrated circuits for electronic applications, including radios and televisions. Such integrated circuits typically use multiple transistors fabricated in single crystal silicon. Many integrated circuits now contain multiple levels of metallization for interconnections.

Semiconductor devices are being scaled in the horizontal dimension to reduce wafer cost by obtaining more chips per wafer or by increasing circuit complexity by obtaining more transistors per chip. Although semiconductor devices are being scaled in the horizontal dimension, semiconductor devices are not generally being scaled in the vertical dimension (because the current density would exceed reliability limits). Thus, conductors may have a high aspect ratio (ratio of conductor height to conductor width of greater than one). With horizontal scaling, these tall metal leads are being packed closer and closer together, causing capacitive coupling between the leads to become the primary limitation to circuit speed. If line-to-line capacitance is high, a likelihood for electrical inefficiencies and inaccuracies exist. Reducing the capacitance within these multi-level metallization systems will reduce the RC time constant between the lines.

Typically, the material used to isolate metal lines from each other is silicon dioxide. However, the dielectric constant of dense silicon oxide grown by thermal oxidation or chemical vapor deposition is on the order of 3.9. The dielectric constant is based on a scale where 1.0 represents the dielectric constant of a vacuum. Various materials exhibit dielectric constants from very near 1.0 to values in the hundreds. As used herein, the term low-dielectric will refer to a material with a dielectric constant of less than 3.5.

SUMMARY OF THE INVENTION

Recently, attempts have been made to use low-dielectric constant materials to replace silicon dioxide as a dielectric material. The use of low-dielectric constant materials as insulating layers reduces the capacitance between the lines (or leads), thus reducing the RC time constant. An apparently heretofore-unrecognized problem is that, especially in high aspect ratio metal leads, the decreased thermal conductivity of low-dielectric constant materials may result in metal lead breakage due to the effects of Joule's heat. The present invention solves this problem by improving the thermal conductivity of the structure, resulting in improved reliability of metal leads in structures using low-dielectric constant materials.

The invention encompasses a method for manufacturing semiconductor devices having metal leads with improved reliability, and a device for same, comprising metal leads on a substrate, dummy leads proximate said metal leads, a low-dielectric constant material between the metal leads, and a thermoconductive insulating layer on the dummy leads, metal leads and low-dielectric constant material. Heat from the metal leads is transferable to both the dummy leads and the thermoconductive insulating layer. The combination of the dummy leads and the thermoconductive insulating layer has a synergistic effect in dissipating the heat. The low-dielectric constant material has a dielectric constant of less than 3.5. An advantage of the invention is improved reliability of metal leads for circuits using low-dielectric constant materials.

One preferred embodiment of the invention involves depositing a metal interconnect layer on a substrate and etching the metal interconnect layer in a predetermined pattern to form metal leads and dummy leads. A low-dielectric constant material is deposited between the metal leads. Then, a thermoconductive insulating layer (a layer having a thermoconductivity at least 20% higher than the thermal conductivity of the low-dielectric constant material and preferably 20% larger than $SiO_2$) is deposited over the metal leads, the dummy leads, and the low-dielectric constant material.

Another embodiment involves depositing a metal interconnect layer on a substrate and etching the metal interconnect layer in a predetermined pattern to form metal leads. A low-dielectric constant material is deposited between the metal leads. A thermoconductive insulating layer is deposited over the metal leads and the low-dielectric constant material. Dummy leads are formed on the thermoconductive insulating layer proximate the metal leads. Heat from the metal leads is dissipatable through the dummy leads and thermoconductive insulating layer.

An advantage of the invention is to improve reliability of metal leads for circuits using low-dielectric constant materials. The invention is particularly beneficial to semiconductors having a combination of metal leads with high aspect ratios and low-dielectric constant materials which are more thermally insulating.

BRIEF DESCRIPTION OF THE DRAWINGS

In the drawings, which form an integral part of the specification and are to be read in conjunction therewith, and in which like numerals and symbols are employed to designate similar components in various views unless otherwise indicated.

DETAILED DESCRIPTION OF PREFERRED EMBODIMENTS

Figures 1A, 1B, 1C:
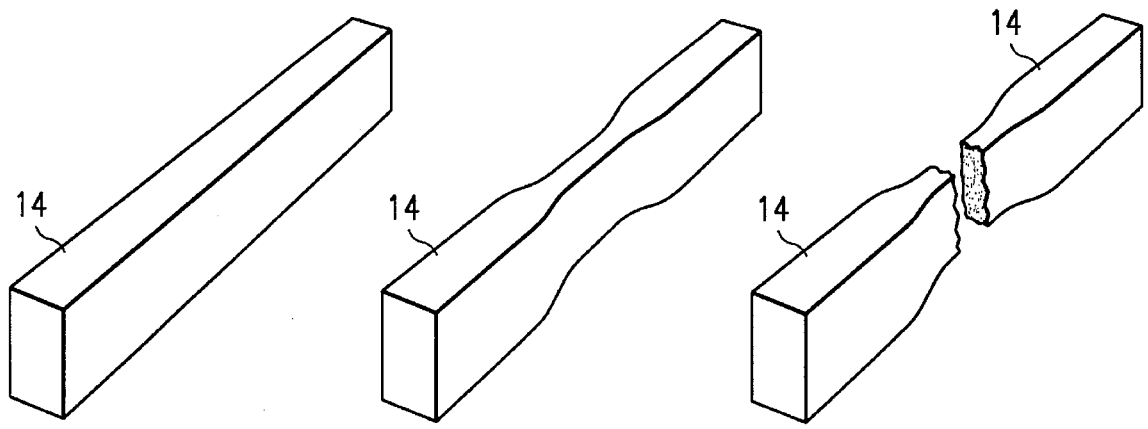
FIGS. 1A–1C are three-dimensional views of a metal lead of a semiconductor wafer, showing the negative effects of Joule's heat.

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

The following is a description of several preferred embodiments and alternative embodiments, including manufacturing methods. Corresponding numerals and symbols in the different figures refer to corresponding parts unless otherwise indicated. Table 1 below provides an overview of the elements of the embodiments and the drawings.

TABLE 1

| Drawing Element | Preferred or Specific Examples | Generic Term | Other Alternate Examples or Descriptions |
|---|---|---|---|
| 10 | | Semiconductor wafer | |
| 12 | Silicon | Substrate | May be other metal interconnect layers or semiconductor elements, (e.g. transistors, diodes); Oxides; Compound semiconductors (e.g. GaAs, InP, Si/Ge, SiC). |
| 14 | Aluminum alloy | Metal leads | Titanium trilayer (TiN/AlCu/TiN); Alloys of Cu, Mo, W, Ti, Si; Polysilicon, silicides, nitrides, carbides; AlCu alloy with Ti or TiN underlayers; Metal interconnect layer. |
| 16 | Aluminum Alloy | Dummy leads | Titanium trilayer (TiN/AlCu/TiN); Alloys of Cu, Mo, W, Ti, Si; Polysilicon, silicides, nitrides, carbides; AlCu alloy with Ti or TiN underlayers. |
| 18 | OSOG (organic spin-on glass) | Low-dielectric constant material | Air gap (also inert gases, vacuum); silica aerogel; other aerogels or xerogels; fluorinated silicon oxide. |
| 22 | AlN | Thermoconductive insulating layer | $Si_3N_4$; both AlN and $Si_3N_4$ (e.g. bilayer or trilayer of $Si_3N_4$/AlN/$Si_3N_4$); Insulative material with a thermal conductivity 20% larger than the thermal conductivity of low-dielectric constant material 18 and preferably 20% larger than $SiO_2$; annealed $SiO_2$ |
| 24 | AlN | Thin thermoconductive layer | Insulative material with a thermal conductivity 20% larger than the thermal conductivity of low-dielectric constant material 18 and preferably 20% larger than $Si_3N_4$. |

An apparently heretofore-unrecognized problem is that the decreased thermal conductivity of low-dielectric constant materials may result in metal lead breakage due to the effects of Joule's heat, especially in high aspect ratio conductors with low-dielectric constant material between conductors, where the low-dielectric constant material is on more than half the conductor perimeter. Since all metals have a certain amount of resistance, the temperature of a metal rises as a current passes through it. Such heat through a metal lead is known as Joule's heat. As a metal lead heats locally in one portion along it, the resistance in that portion rises slightly (due to properties of the metal), causing the temperature in that portion to rise even more (although slightly). Thus, locally heated metals can be damaged or fractured. The thinner the metal lead, the weaker it is (which is particularly a concern in submicron circuits). The use of low-dielectric constant materials as insulative layers further present a problem, for such materials generally have poor thermoconductivity. With the use of low-dielectric constant materials, much more of the Joule's heat generated in metal leads of a circuit remains concentrated in the lead itself.

The effect of Joule's heat on a metal lead is shown in FIG. 1. FIG. 1A shows a metal lead 14 of a semiconductor wafer (other portions of the wafer are not shown). The cross-section of the lead is typically rectangular-shaped, with the height being greater than the width (a high aspect ratio), because of scale-down. The metal lead has been scaled in the lateral direction, but scale-down in the vertical direction is limited by electrical conductivity requirements of the circuit. When current flows through metal lead 14, the metal lead is heated. In reality, a metal lead has thin and fragile portions. Such unevenness cannot be avoided because photolithography and etching processes of metal leads are not ideal. Electromigration, intensified by Joule's heat, causes the metal lead to first weaken, and then thin. The thin and fragile portions of the metal lead becomes thinner and thinner as current is cycled through the metal lead (FIG. 1B), and electromigration is even further intensified in this portion. Eventually such leads can break, as shown in FIG. 1C, resulting in device failures.

Due to the rectangular cross-sectional shape of the metal leads and the likelihood of leads in an adjacent layer being perpendicular, the parasitic capacitance; in the vertical direction (from layer to layer) in multilevel metal interconnect schemes is less of a concern than in the lateral direction. Parasitic capacitance can be excessive between leads in the same metal plane if measures are not taken to reduce the capacitance. The distances from other metal planes are usually large enough so capacitance is not a concern in the vertical direction. Additionally, the top face of a metal lead is smaller than the side face, because of the rectangular shape, resulting in a smaller relevant electrode area for parasitic capacitance in the vertical direction.

The present invention, therefore, is based on the novel principle of using high thermoconductivity materials as insulators between metal layers, even if interlayer dielectric properties must be sacrificed, combined with dummy leads adjacent metal leads.

The present invention improves reliability of metal leads in structures using low-dielectric constant materials by using both dummy leads and a thermoconductive insulating layer to improve the thermal conductivity of the structure. The combination of the dummy leads and the thermoconductive insulating layer perform synergistically to diffuse the heat away from metal leads, reducing the negative effects of Joule's heat. The need for this is due to the further recognition that it is often impractical to put dummy leads directly above metal leads, especially since conventional leads in adjacent layers may well be running perpendicular, thus the thermoconductive layer and the dummy leads combine to provide much improved heat dissipation.

Figures 2A, 2B:
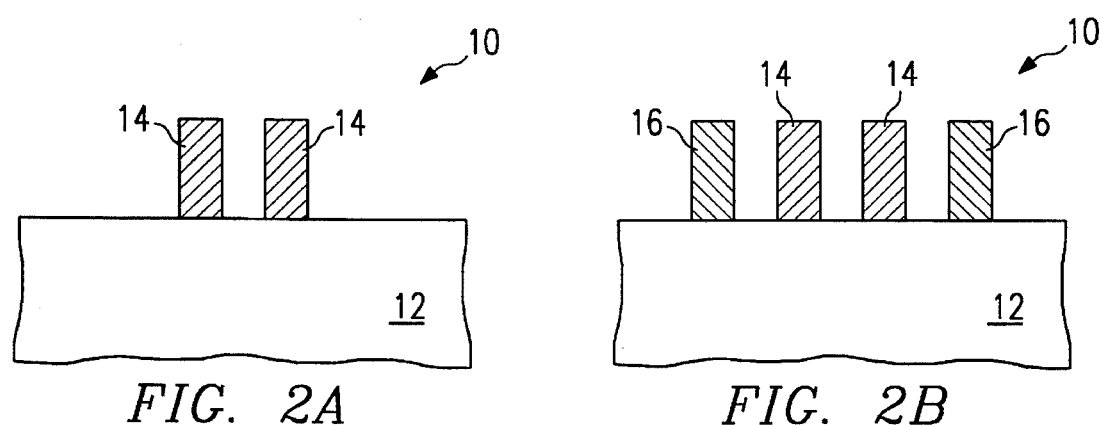
FIGS. 2A–2D are cross-sectional views of a first embodiment of the present invention.

FIG. 2A shows a cross-sectional view of a semiconductor wafer 10 having metal leads 14 formed on a substrate 12. The substrate may, for example, contain transistors, diodes, and other semiconductor elements (not shown) as are well known in the art. The substrate 12 may also contain other metal interconnect layers, and typically contains a top insulating oxide layer (to prevent leads from shorting to each other in subsequent metal layers). A metal interconnect layer has been deposited over the substrate 12. The metal interconnect layer may comprise, for example, aluminum or a titanium-tungsten/aluminum bilayer. The metal interconnect layer is etched with a predetermined pattern to form etch lines, or metal leads 14. Some of the metal leads 14 may be in close proximity to each other, for example, 1 μm or less apart. Dummy leads 16 are formed adjacent metal leads 14 in the same metal interconnect as metal leads 14 are formed in (FIG. 2B).

Figures 2C, 2D:
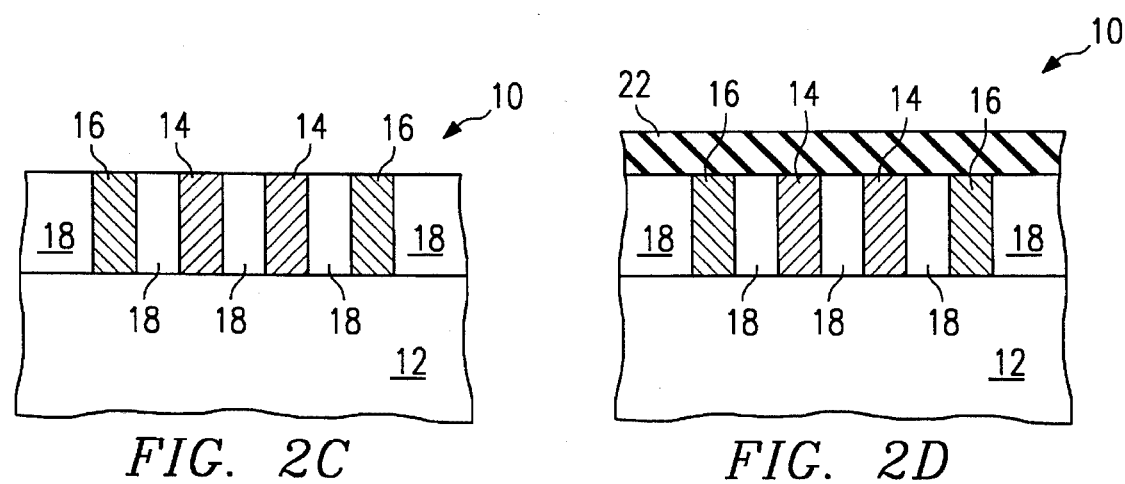

A low-dielectric constant material 18, preferably a silica aerogel, air gap, or organic spin-on glass (OSOG), is formed or deposited between the metal leads 14, as shown in FIG. 2C. Thermoconductive insulating layer 22 is deposited over metal leads 14, dummy leads 16, and the low-dielectric constant material 18, as shown in FIG. 2D. Thermoconductive insulating layer 22 is preferably comprised of AlN, but may also be other insulative materials having a thermal conductivity at least 20% larger than the thermal conductivity of low-dielectric constant material 18 and preferably 20% larger than $SiO_2$ (e.g. trilayer of $Si_3N_4$/AlN/$Si_3N_4$).

The dummy leads 16 diffuse some of the Joule's heat away from the metal leads 14 when the device is in operation. The heat is dissipated through the dummy leads 16, which are in contact with the thermoconductive insulating layer 22. The thermoconductive insulating layer 22 further diffuses the heat from the dummy leads 16. Additionally, the thermoconductive insulating layer 22 directly diffuses the heat from metal leads 14 from areas where the metal leads 14 are in contact with the thermoconductive insulating layer 22. The thermoconductive insulating layer 22 preferably is in direct contact with the metal leads 14 over their entire length.

Figure 3A:
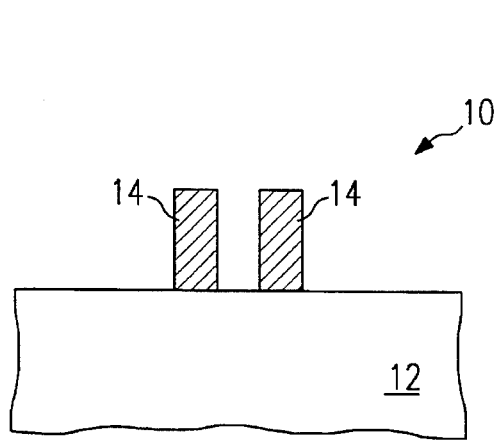
FIGS. 3A–3B are cross-sectional views of a second embodiment of the present invention.
Figure 3B:
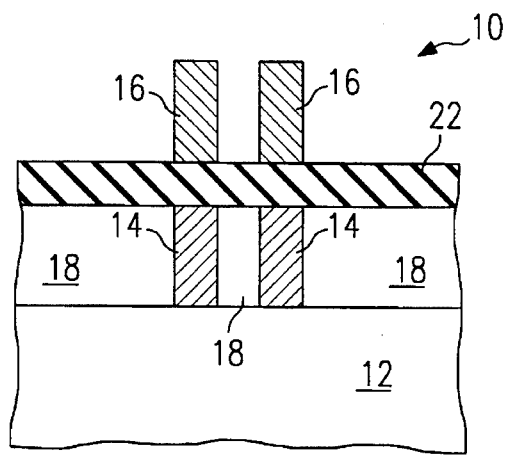

In a second embodiment of the present invention, dummy leads 16 are formed in an adjacent parallel metal layer (along, of course, with the conventional leads of the adjacent parallel metal layer, not shown). Semiconductor wafer 10 comprises a substrate 12. A first metal interconnect layer is deposited over the substrate 12, and metal leads 14 are formed in the first metal interconnect layer (FIG. 3A). A low-dielectric constant material 18 is formed between metal leads 14. Then a thermoconductive insulating layer 22 is deposited on the metal leads 14 and the low-dielectric constant material 18. A second metal interconnect layer (adjacent and parallel to first metal interconnect layer) is deposited over thermoconductive insulating layer 22, and dummy leads 16 are formed adjacent the metal leads 14 (FIG. 3B). Positions of the Joule's heat from metal leads 14 are diffused by thermoconductive insulating layer 22 and by dummy leads 16. Subsequent processing steps may then be performed e.g. further deposition and etching of semiconductor, insulative and metallic layers.

Figure 4:
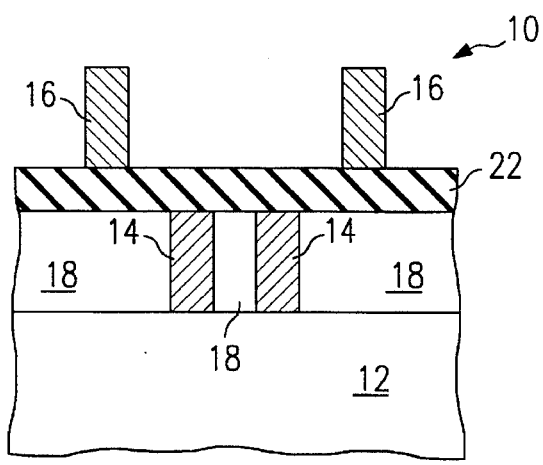
FIG. 4 is a cross-sectional view of a third embodiment.

A third embodiment is shown in FIG. 4, which is similar to the second embodiment, but with dummy leads 16 in the second metal interconnect layer proximate the metal leads 14, rather than adjacent. Heat is transferred (and partially diffused) laterally through the thermoconductive insulating layer 22 to dummy leads 16 where further heat is dissipated.

Figure 5:
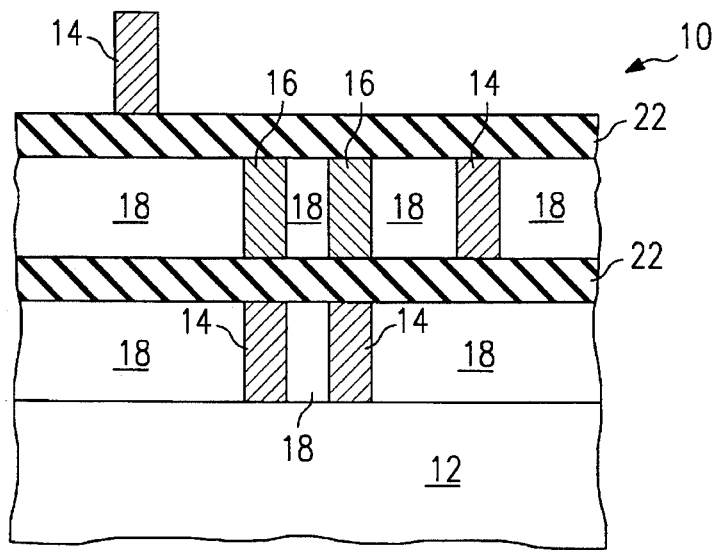
FIG. 5 is a cross-sectional view of a fourth embodiment.

Combinations of the three embodiments may be combined to produce other beneficial structures for Joule's heat dissipation. For example, FIG. 5 shows a fourth embodiment having dummy leads 16 centrally located, which diffuse heat for all of the metal leads 14 shown, including metal leads in adjacent metal layers (either proximate or adjacent the dummy leads 16), and adjacent metal leads in the same layer. Heat travels either laterally, or vertically, or both, through the thermoconductive insulating layer 22 to reach the dummy leads 16, where it is further diffused.

Figure 6:
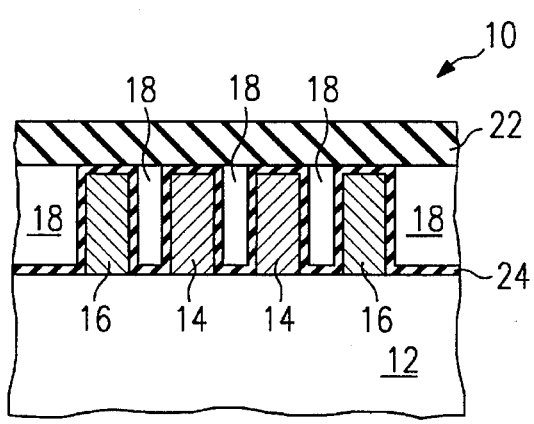
FIG. 6 is a cross-sectional view of an alternate embodiment, showing an additional feature of a thin thermoconductive layer formed on metal leads, which can be used with any of the previous embodiments.

In a fifth embodiment (FIG. 6), semiconductor wafer 10 comprises a substrate 12, upon which metal leads 14 and dummy leads 16 are formed, as described in the first embodiment of the present invention. Portions of the substrate 12 remain exposed between metal leads 14. A thin thermoconductive layer 24 is applied on the exposed portions of the substrate 12 and on the metal leads 14. A low-dielectric constant material 18 is deposited over the thin thermoconductive layer 24, (preferably, but not shown, to a height above) the thin thermoconductive layer 24 on the tops of the metal leads 14. Low-dielectric constant material 18 may be, for example, silica aerogel comprising a sol-gel derived $SiO_2$, consisting of nanometer scaled microparticles connected among each other. Silica aerogel is typically very porous, and has negligible thermal conductivity. If deposited above the metal leads, the aerogel is etched back (planarized), e.g. with CMP (chemical-mechanical polishing), to expose the thin thermoconductive layer 24 on tops of the metal leads 14 while leaving low-dielectric constant material 18 between the metal leads 14. A top portion of the thin thermoconductive layer 24 may be removed during the etch step. Then a thermoconductive insulating layer 22 is deposited on the thin thermoconductive layer 24 on metal leads 14, dummy leads 16, and on low-dielectric constant material 18 (FIG. 6). A portion of the Joule's heat from metal leads 14 is transferable through the thin thermoconductive layer 24 to thermoconductive insulating layer 22, where the heat is diffused. A portion of the heat may transfer from the metal leads 14 through the thermoconductive insulating layer 24 to the dummy leads 16, where the heat is further diffused.

The thin thermoconductive layer 24 of the fifth embodiment may be used with the second, third and fourth embodiments, as well. The present invention can also be used on semiconductors using other low-dielectric constant materials, such as air gaps, xerogels, polymers, or spin-on glasses, for example. To reduce capacitive coupling between leads, low-dielectric constant materials are being investigated, such as pure polymers (e.g. parylene, teflon, polyimide) or organic spin-on glass (OSOG, e.g. silsequioxane or siloxane glass). Refer to U.S. Pat. No. 4,987,101 issued to Kaanta et al on Jan. 22, 1991 which describes a method for fabricating gas (air) dielectrics; and U.S. Pat. No. 5,103,288 issued to Sakamoto on Apr. 7. 1992 which describes a multilayered wiring structure which decreases capacitance by using a porous dielectric.

The novel method of using both dummy leads and a thermoconductive insulating layer to dissipate heat from metal leads is beneficial to semiconductors having submicron spacing and using low-dielectric constant materials. The thermoconductive insulating layer and dummy leads diffuse a portion of the Joule's heat generated in the metal leads, thus enhancing reliability of metal leads. Combining both methods of heat diffusion has a synergistic effect, due to the transfer of heat through the thermoconductive insulating layer to the dummy leads (and heat is diffused along the way). The cooperative action of the two features is such that the total effect is greater than the sum of the effects taken independently. The invention is particularly beneficial to semiconductors having a combination of metal leads with high aspect ratios (e.g. 2 or greater) and low-dielectric constant materials (especially having a low-dielectric constant of less than 2) which are more thermally insulating.

While the invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for enhancing reliability of metal leads of a semiconductor device, comprising the steps of:

forming at least two metal leads on a substrate;

depositing a low-dielectric constant material at least between said metal leads;

depositing a thermoconductive insulating layer on at least the tops of said metal leads, said thermoconductive insulating layer comprising AlN, $Si_3N_4$ or both;

forming dummy leads proximate said metal leads; and heating said metal leads;

wherein heat from said metal leads is transferable to said dummy leads and said thermoconductive insulating layer and is dissipatable, said low-dielectric constant material having a dielectric constant of less than 3.5.

2. The method of claim 1 further comprising the step of depositing a metal layer adjacent said thermoconductive layer, after said thermoconductive insulating layer depositing step, wherein said dummy leads are formed from said metal layer.

3. The method of claim 1 wherein said forming dummy leads step is performed during said forming metal leads step.

4. The method of claim 1 wherein said thermoconductive insulating layer comprises AlN.

5. The method of claim 1 wherein the spacing between said metal leads is less than one µm.

6. The method of claim 1 wherein said thermoconductive insulating layer has a thermal conductivity greater than the thermal conductivity of said low-dielectric constant material.

7. The method of claim 1 further comprising the step of depositing a first thermoconductive layer on at least said metal leads, after said forming said metal lead step, wherein heat from said metal leads is transferred to said first thermoconductive layer, said dummy leads and said thermoconductive insulating layer.

8. The method of claim 7 further comprising the step of etching said low-dielectric constant material to expose said first thermoconductive layer on said metal leads, after said depositing a low-dielectric constant material, and wherein said depositing a low-dielectric constant material is performed over at least said metal leads.

9. The method of claim 8 wherein a top portion of said first thermoconductive layer is removed during said etching step.

10. The method of claim 8 wherein the spacing between said metal leads is less than one µm.

11. The method of claim 8 wherein said metal leads have an aspect ratio greater than 2.

12. A method for enhancing reliability of metal leads of a semiconductor device, comprising the steps of:

forming at least two metal leads and dummy leads on a substrate;

depositing a first thermoconductive layer on at least said metal leads and said dummy leads;

depositing a low-dielectric constant material on said first thermoconductive layer at least between said metal leads;

depositing a thermoconductive insulating layer on at least the tops of said metal leads and said dummy leads, said thermoconductive insulating layer comprising AlN; and heating said metal leads;

wherein heat from said metal leads is transferable to said dummy leads, said first thermoconductive layer and said thermoconductive insulating layer and is dissipatable, said low-dielectric constant material having a dielectric constant of less than 3.5.

13. The method of claim 12 wherein the spacing between said metal leads is less than one μm.

14. The method of claim 12 wherein said thermoconductive insulating layer has a thermal conductivity greater than the thermal conductivity of said low-dielectric constant material.

15. The method of claim 12 further comprising the step of etching said low-dielectric constant material to expose said first thermoconductive layer on said metal leads, after said step of depositing a low-dielectric constant material.

16. The method of claim 15 wherein a top portion of said first thermoconductive layer is removed during said etching step.

17. The method of claim 15 wherein the spacing between said metal leads is less than one μm.

18. The method of claim 12 wherein said metal leads have an aspect ratio greater than 2.

* * * * *